(12) United States Patent
Takahashi et al.

(10) Patent No.: US 11,901,159 B2
(45) Date of Patent: Feb. 13, 2024

(54) RF GENERATOR DEVICE AND SUBSTRATE PROCESSING APPARATUS

(71) Applicant: HITACHI KOKUSAI ELECTRIC INC., Tokyo (JP)

(72) Inventors: Naoto Takahashi, Tokyo (JP); Naoya Fujimoto, Tokyo (JP); Sunao Egashira, Tokyo (JP); Yoshiyuki Oshida, Tokyo (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 474 days.

(21) Appl. No.: 17/268,100

(22) PCT Filed: Sep. 13, 2018

(86) PCT No.: PCT/JP2018/033906
§ 371 (c)(1),
(2) Date: Feb. 12, 2021

(87) PCT Pub. No.: WO2020/054005
PCT Pub. Date: Mar. 19, 2020

(65) Prior Publication Data
US 2022/0115210 A1 Apr. 14, 2022

(51) Int. Cl.
*H01L 21/326* (2006.01)
*C23C 16/00* (2006.01)
(Continued)

(52) U.S. Cl.
CPC ...... *H01J 37/32183* (2013.01); *H01J 37/321* (2013.01); *H01J 37/32165* (2013.01);
(Continued)

(58) Field of Classification Search
CPC ............... H01J 37/321; H01J 37/32165; H01J 37/32174; H01J 37/32183
See application file for complete search history.

(56) References Cited

U.S. PATENT DOCUMENTS 5,401,350 A * 3/1995 Patrick .................. H01J 37/321
204/298.34
5,571,366 A * 11/1996 Ishii ..................... H01J 37/3299
216/60
(Continued)

FOREIGN PATENT DOCUMENTS

JP S62-273731 A 11/1987
JP H09-120898 A 5/1997
(Continued)

OTHER PUBLICATIONS

International Search Report cited in International Appln. No. PCT/JP2018/033906 dated Nov. 20, 2018.

*Primary Examiner* — Luz L Alejandro Mulero
(74) *Attorney, Agent, or Firm* — BACON&THOMAS,PLLC

(57) ABSTRACT

A radio frequency (RF) generator device for supplying RF powers of different frequencies to multiple antennas disposed in a chamber is provided. The RF generator device includes a plurality of RF generators configured to supply the RF powers of the different frequencies to the multiple antennas, and a plurality of RF controllers configured to control the RF generators, respectively. Each of the RF controllers includes a fast Fourier transformer, and a filter. The fast Fourier transformer performs fast Fourier transform on a signal introduced as a reflected wave to decompose the signal into frequency components, and the filter removes waves having frequency components that are not outputted from the corresponding RF generator.

10 Claims, 10 Drawing Sheets

(51) Int. Cl.
   *H01J 37/32*       (2006.01)
   *H04L 27/26*       (2006.01)

(52) U.S. Cl.
   CPC ...... *H01J 37/32174* (2013.01); *H04L 27/265*
              (2013.01); *H01J 2237/327* (2013.01)

(56) References Cited

U.S. PATENT DOCUMENTS

| | | | |
|---|---|---|---|
| 5,907,221 A * | 5/1999 | Sato | H01J 37/321 |
| | | | 315/111.21 |
| 2004/0007984 A1 | 1/2004 | Coumou et al. | |
| 2006/0057854 A1 | 3/2006 | Setsuhara et al. | |
| 2006/0225653 A1 * | 10/2006 | Xu | H01J 37/321 |
| | | | 345/37 |
| 2008/0206483 A1 * | 8/2008 | Paterson | H01J 37/32091 |
| | | | 427/570 |
| 2010/0304046 A1 | 12/2010 | Miyake et al. | |
| 2014/0320013 A1 | 10/2014 | Coumou et al. | |
| 2015/0311040 A1 | 10/2015 | Kawaguchi et al. | |
| 2018/0211818 A1 | 7/2018 | Kubota et al. | |

FOREIGN PATENT DOCUMENTS

| | | |
|---|---|---|
| JP | 2004-152606 A | 5/2004 |
| JP | 2004-228354 A | 8/2004 |
| JP | 2005-532668 A | 10/2005 |
| JP | 2014-239029 A | 12/2014 |
| JP | 2015-211093 A | 11/2015 |
| WO | WO2004/064460 A1 | 7/2004 |
| WO | WO2017-014210 A1 | 1/2017 |

* cited by examiner

RF GENERATOR DEVICE AND SUBSTRATE PROCESSING APPARATUS

TECHNICAL FIELD

The present disclosure relates to a radio frequency (RF) generator device and a substrate processing apparatus.

BACKGROUND

In a substrate processing apparatus using plasma, an antenna for RF generation is disposed in a chamber, and RF power is supplied from an RF generator device to the antenna to generate plasma in the chamber.

Patent Document 1: Japanese Patent Application Publication No. 2014-239029
Patent Document 2: International Patent Application Publication No. WO2004/064460
Patent Document 3: Japanese Patent Application Publication No. 2004-228354
Patent Document 4: Japanese Patent Application Publication No. 2005-532668

The present inventors have studied an RF generator device for supplying RF power to a plurality of antennas disposed in a chamber of a substrate processing apparatus.

As a result, it was found that when RF powers having frequencies close to each other are applied from two antennas, for example, interference occurs between the antennas or through plasma. Therefore, even if performing impedance matching on one antenna is attempted, it was found that the impedance matching may not be completed as it is deemed that a reflected wave is not reduced due to interference by an interference wave from the other antenna.

An object of the present disclosure is to provide an RF generator device capable of eliminating the effect of interference waves at the time of performing impedance matching.

Further, other objects and novel features will become apparent from the description and the accompanying drawings of the specification.

SUMMARY

The following is a brief description of the representative features of the present disclosure.

A radio frequency (RF) generator device for supplying RF powers of different frequencies to multiple antennas disposed in a chamber includes a plurality of RF generators configured to supply the RF powers of the different frequencies to the multiple antennas, and a plurality of RF controllers configured to control the RF generators, respectively. Each of the RF controllers includes a fast Fourier transformer, and a filter. The fast Fourier transformer performs fast Fourier transform on a signal introduced as a reflected wave to decompose the signal into frequency components, and the filter removes waves having frequency components that are not outputted from the corresponding RF generator.

Effect

In accordance with the RF generator device, it is possible to eliminate an effect of an interference wave at the time of impedance matching.

DETAILED DESCRIPTION

Figure 1A:
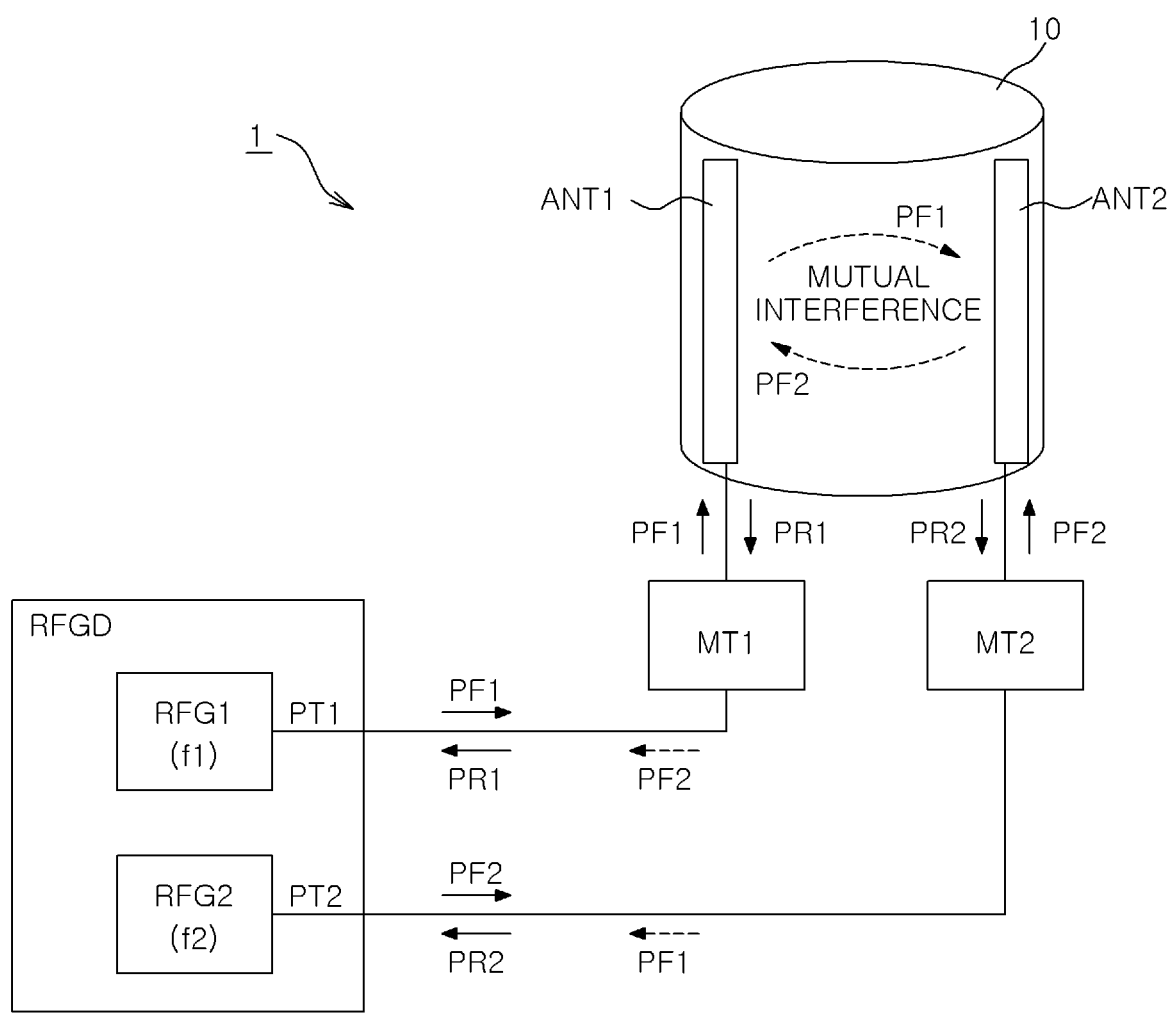
FIG. 1A shows a schematic configuration of a substrate processing apparatus including an RF generator device according to an embodiment.

Hereinafter, embodiments and modification examples will be described with reference to the accompanying drawings. In the following description, like reference numerals will be given to like parts, and redundant description thereof may be omitted. The drawings may be schematically illustrated compared to actual embodiments for clarity. However, they are merely examples and do not limit the interpretation of the present disclosure.

Embodiment

Figure 1B:
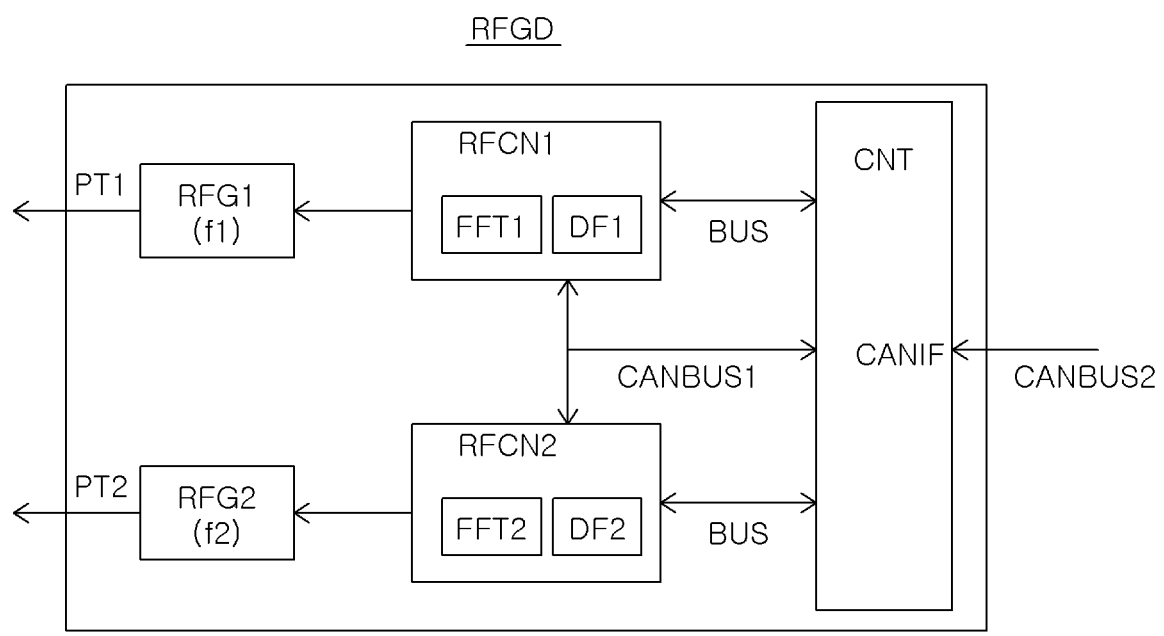
FIG. 1B shows a configuration of the RF generator device according to the embodiment.

FIGS. 1A and 1B show a schematic configuration of a substrate processing apparatus having a radio frequency (RF) generator device according to an embodiment. FIG. 1A shows a schematic configuration of the substrate processing apparatus, and FIG. 1B shows a configuration of the RF generator device.

As shown in FIG. 1A, a substrate processing apparatus 1 includes a chamber 10 as a plasma reactor, two antennas ANT1 and ANT2 disposed in the chamber 10, an RF generator device RFGD, and matching circuits MT1 and MT2.

The chamber 10 is a cylindrical reactor made of, for example, quartz. One or a plurality of substrates such as a semiconductor substrate are disposed in the chamber 10 and subjected to film formation using plasma or etching using plasma. Although the chamber 10 is illustrated as a cylindrical reactor in FIG. 1A, the chamber 10 is not limited thereto. The chamber 10 may be a cube-shaped reactor. Further, the substrate is not limited to a semiconductor substrate, and may be a glass substrate used for manufacturing a display panel.

The antennas ANT1 and ANT2 are provided to generate plasma in the chamber 10. The antenna ANT1 is connected to an output of an RF generator RFG1 of the RF generator device RFGD through the matching circuit MT1. The antenna ANT2 is connected to an output of an RF generator RFG2 of the RF generator device RFGD through the matching circuit MT2. Although two antennas ANT1 and ANT2 are disposed in the chamber 10 in the present example, the number of antennas may be three or more.

The RF generator device RFGD includes the RF generator RFG1 for generating RF power having a frequency f1 and the RF generator RFG2 for generating RF power having a frequency f2. In the present example, the RF generator device RFGD includes a first port PT1 to which the output of the RF generator RFG1 is supplied and a second port PT2 to which the output of the RF generator RFG2 is supplied.

The matching circuits MT1 and MT2 include elements such as a variable capacitor and the like, and perform impedance matching with plasma sources such as the antennas ANT1 and ANT2.

As shown in FIG. 1B, the RF generator device RFGD further includes an RF controller RFCN1 for controlling the RF generator RFG1, an RF controller RFCN2 for controlling the RF generator RFG2, and a control unit CNT for controlling the RF controllers RFCN1 and RFCN2.

The control unit CNT is a control module for controlling the entire RF generator device RFGD. The RF controller RFCN1 and RFCN2 are modules for controlling the RF outputs of the ports (the first port PT1 and the second port PT2) and the impedance matching.

Each of the RF controllers RFCN1 and RFCN2 is connected to the control unit CNT by a low voltage differential signaling (LVDS) bus BUS and a control area network (CAN) bus CANBUS1, so that a bidirectional information transmission path is established. Further, the control unit CNT has a CAN interface CANIF and performs CAN communication with an external device while being connected to a CAN bus CANBUS2.

The RF controller RFCN1 includes a fast Fourier transformer FFT1 and a digital filter DF1. The RF controller RFCN2 includes a fast Fourier transformer FFT2 and a digital filter DF2.

Next, the object will be described with reference to FIG. 1A.

As shown in FIG. 1A, when the RF power having the frequency f1 and the RF power having the frequency f2 that is close to the frequency f1 are respectively applied from the two antennas ANT1 and ANT2 to the chamber 10, mutual interference may occur between the antennas ANT1 and ANT2 or through plasma. When the RF powers are respectively supplied from the RF generators RFG1 and RFG2, the power applied from the RF generator RFG1 to the antenna ANT1 is partially coupled to the other antenna ANT2. Accordingly, when viewed from the RF generator RFG2, it seems that a reflected wave PF1 has returned thereto.

Therefore, even if performing impedance matching on one antenna ANT1 or ANT2 is attempted, the impedance matching may not be completed because it is deemed that the reflected wave is not reduced due to interference by an interference wave from the other antenna. FIG. 1A shows a traveling wave PF1 outputted from the first port PT1 being seen as a reflected wave of the second port PT2, and a traveling wave PF2 outputted from the second port PT2 being seen as a reflected wave of the first port PT1. An RF reflected wave PR1 of a radio wave outputted from the first port PT1 and an RF reflected wave PR2 of a radio wave outputted from the second port PT2 can be reduced by performing impedance matching using the matching circuits MT1 and MT2. However, an interference wave PF2 inputted to the first port PT1 and the interference wave PF1 inputted to the second port PT2 cannot be reduced only by allowing the first port PT1 and the second port PT2 to individually perform their impedance matchings.

In the present disclosure, the above object is solved by adopting the following configuration.

In other words, the present disclosure suggests a frequency control method of an RF generator used for frequency matching to eliminate an effect of an interference wave at the time of matching operation.

Specifically, when multiple RF outputs are applied to two or more antennas ANT1 and ANT2, the RF generator device RFGD controls the frequencies of the RF outputs such that the respective frequencies of the RF outputs operate within a range where interference can be eliminated.

Each of the fast Fourier transformers FFT1 and FFT2 of the RF controllers RFCN1 and RFCN2 performs fast Fourier transform (FFT) on a signal introduced as a reflected wave to decompose the signal into frequency components. The digital filter DF1 or DF2 of the RF controller RFCN1 or RFCN2 remove waves having the frequency components that are not outputted from the corresponding RF generator.

The control unit CNT partially restricts the operation of frequency matching such that a difference between the frequencies (the frequency f1 of the RF power of the RF generator RFG1 and the frequency f2 of the RF power of the RF generator RFG2) is within a range where interference can be removed by attenuation in the digital filter DF1 or DF2.

Figure 2:
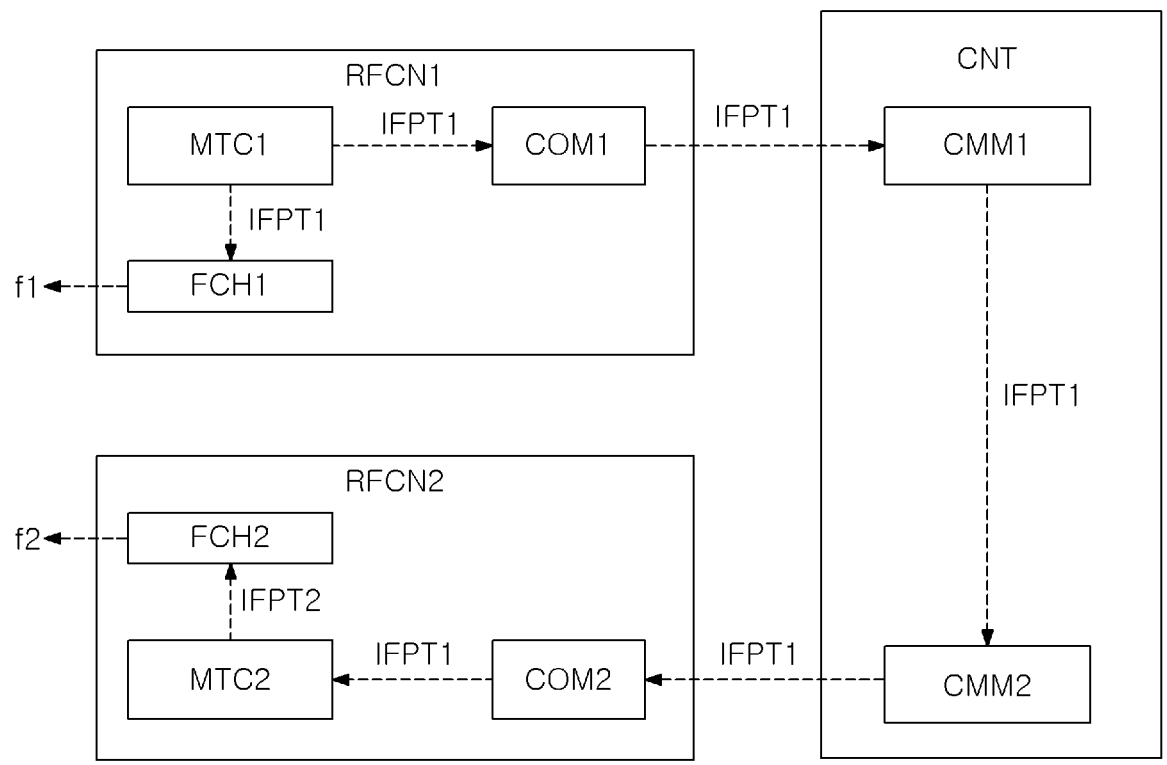
FIG. 2 shows an example of a logical configuration of an RF controller and a control unit of FIG. 1B.

FIG. 2 shows an example of a logical configuration of the RF controller and the control unit of FIG. 1B.

The RF controller RFCN1 includes a matching operation unit MTC1, a frequency operating unit FCH1, and a communication unit COM1. The RF controller RFCN2 includes a matching operation unit MTC2, a frequency operating unit FCH2, and a communication unit COM2. The control unit CNT includes a communication unit CMM1 and a communication unit CMM2.

A frequency setting method of the RF controller RFCN1 and the RF controller RFCN2 will be described with reference to FIG. 2. The RF controller RFCN1 is used as a master, and the RF controller RFCN2 is used as a slave. The master and the slave can be determined by using DIP switches disposed in the RF controllers RFCN1 and RFCN2. The master RF controller RFCN1 does not particularly perform an operation for avoiding interference, and the slave RF controller RFCN2 performs an operation for avoiding interference.

First, the matching operation unit MTC1 determines a frequency f1 used for impedance matching of the first port PT1 from a predetermined matching algorithm.

The matching operation unit MTC1 transmits frequency information IFPT1 to the frequency operating unit FCH1. The frequency operating unit FCH1 outputs RF power having the desired frequency f1 from the RF generator RFG1 of the first port PT1.

Further, the matching operation unit MTC1 transmits the frequency information IFPT1 to the communication unit COM1. The communication unit COM1 outputs the frequency information IFPT1 to the communication unit CMM1 of the control unit CNT through the bus BUS.

Further, the communication unit CMM1 outputs the frequency information IFPT1 of the first port PT1 to the communication unit CMM2. The communication unit CMM2 outputs the frequency information IFPT1 of the first port PT1 to the communication unit COM2 of the RF controller RFCN2 through the bus BUS. The communication unit COM2 outputs the frequency information IFPT1 of the first port PT1 to the matching operation unit MTC2.

The matching operation unit MTC2 of the RF controller RFCN2 compares the frequency information IFPT1 of the first port PT1 inputted from the communication unit COM2 with a frequency calculated from a predetermined matching algorithm to determine a frequency f2 used for impedance matching of the second port PTS. The matching operation unit MTC2 outputs frequency information IFPT2 of the second port PT2 to the frequency operating unit FCH2. Accordingly, the frequency operating unit FCH2 outputs RF power having the desired frequency f2 from the RF generator RFG2 of the second port PT2.

Figure 3:
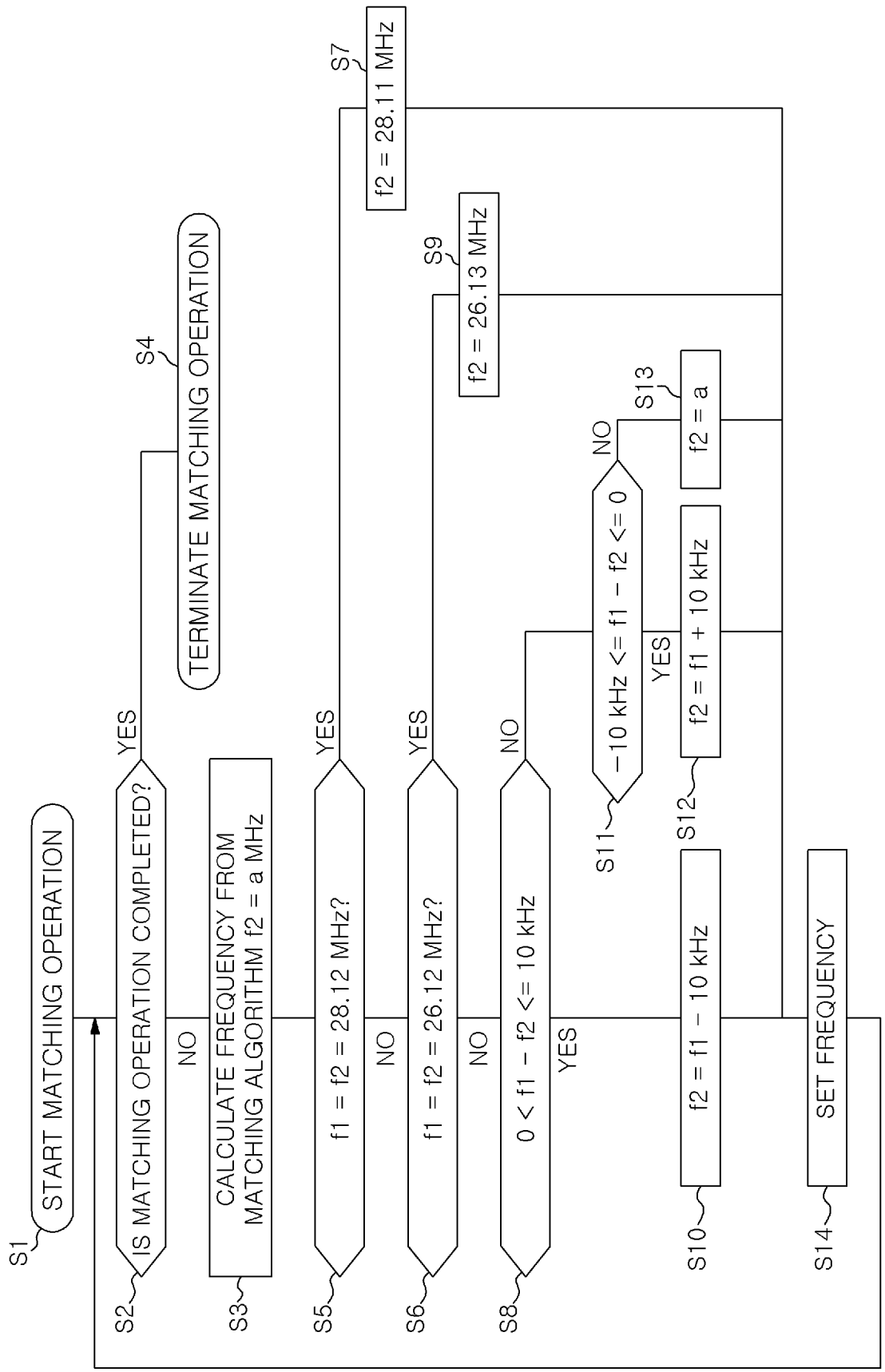
FIG. 3 is a flowchart showing a frequency comparison method in an RF controller RFCN2 of a second port PT2.

FIG. 3 is a flowchart showing a frequency comparison method in the RF controller RFCN2 of the second port PT2. In FIG. 3, "f1" indicates the output frequency of the first port PT1 and "f2" indicates the output frequency of the second port PT2. The RF controller RFCN2 determines a frequency "a MHz" required for impedance matching calculated by the matching operation unit MTC2. However, when a difference frequency with the frequency f1 on the first port PT1 side is within 10 kHz, a value at which the difference frequency with the frequency f1 becomes 10 kHz is finally adopted. 10 kHz is the minimum value of a frequency band in which interference between the first port PT1 and the second port PT2 can be suppressed by the digital filter DF1 and DF2. The difference frequency of 10 kHz is obtained in the case of using the undersampling technique for the digital filters DF1 and DF2. If the oversampling technique is used for the digital filters DF1 and DF2, the difference frequency can be adjusted to be, for example, 1 kHz, which is smaller than 10 kHz.

The respective steps will be described with reference to FIG. 3.

Step S1: The matching operation is started.

Step S2: It is determined whether or not the matching operation is completed. If the matching operation is not completed (NO in step S2), the process proceeds to step S3. When the matching operation is completed (YES in step S2), the process proceeds to step S4, and the matching operation is terminated.

Step S3: A frequency is calculated from a predetermined matching algorithm. Here, it is assumed a condition "f2=a MHz" is satisfied.

Step S5: It is determined whether or not f1 and f2 are equal to 28.12 MHz ("f1=f2=28.12 MHz?"). Here, 28.12 MHz is a maximum frequency that can be outputted from the RF generator device RFGD. If f1 and f2 are not equal to 28.12 MHz, the process proceeds to step S6. If f1 and f2 are equal to 28.12 MHz, the process proceeds to step S7. In step S7, a value (28.12 MHz-10 kHz=28.11 MHz) obtained by subtracting 10 kHz from the value (28.12 MHz) of f2 is set as a value of a matched frequency f2, and the process proceeds to step S14 to set the frequency f2. In this case, f1 is 28.12 MHz.

Step S6: It is determined whether or not f1 and f2 are equal to 26.12 MHz ("f1=f2=26.12 MHz?"). Here, 26.12 MHz is a minimum frequency that can be outputted from the RF generator device RFGD. If f1 and f2 are not equal to 26.12 MHz, the process proceeds to step S8. If f1 and f2 are equal to 26.12 MHz, the process proceeds to step S9. In step S9, a value (26.12 MHz+10 kHz=26.13 MHz) obtained by adding 10 kHz to the value of (26.12 MHz) f2 is set as a value of a matched frequency f2, and the process proceeds to step S14 to set the frequency f2. In this case, f1 is 26.12 MHz.

Step S8: It is determined whether or not a difference frequency between f1 and f2 satisfies a condition 0<f1-f2<=10 kHz. If the difference frequency satisfies the condition, the process proceeds to step S10. If the difference frequency does not satisfy the condition, the process proceeds to step S11.

Step 10: A value (f2=f1-10 kHz) obtained by subtracting 10 kHz from the value of f1 is set as a value of a matched frequency f2, and the process proceeds to step S14 to set the frequency f2.

Step S11: It is determined whether or not the difference frequency between f1 and f2 satisfies a condition "-10 kHz<=f1-f2<=0." If the difference frequency satisfies the condition, the process proceeds to step S12. If the difference frequency does not satisfy the condition, the process proceeds to step S13.

Step S12: A value (f2=f1+10 kHz) obtained by adding 10 kHz to the value of f1 is set as a value of a matched frequency f2, and the process proceeds to step S14 to set the frequency f2.

Step S13: A value of f2 becomes equal to the value (a Mhz) of the frequency (f2=a Mhz) calculated from the predetermined matching algorithm of step 3, and the process proceeds to step S14 to set the frequency f2.

After step S14, the process proceeds to step S2 to determine again whether or not the matching operation is completed.

Figure 4:
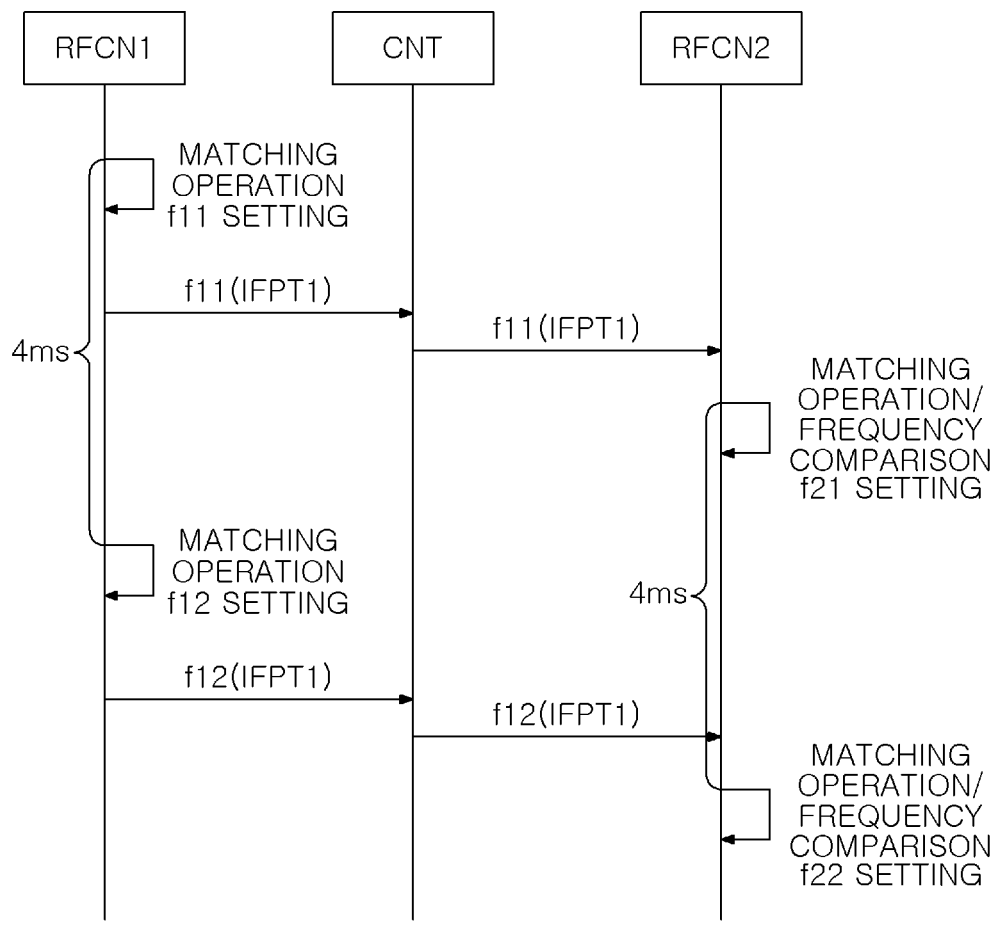
FIG. 4 shows an operation sequence of the RF controller and the control unit.

FIG. 4 shows an operation sequence of the RF controller and the control unit. In FIG. 4, "f11" and "f12" indicate the frequencies of the RF generator RFG1 of the first port PT1, and "f21" and "f22" indicate the frequencies of the RF generator RFG2 of the second port PT2. Further, "f11" and "f21" indicate first setting values, and f12 and f22 indicate second setting values.

First, the RF controller RFCN1 performs a first matching operation using a predetermined matching algorithm to set the frequency f11 of the RF generator RFG1 of the first port PT1. The information of the set frequency f11 is transmitted, as the frequency information IFPT1 of the first port PT1, to the RF controller RFCN2 through the control unit CNT.

The RF controller RFCN2 performs a first matching operation using a predetermined matching algorithm and the frequency comparison shown in FIG. 3 while referring to the received information IFPT1 of the frequency f11 to set the frequency f21 of the RF generator RFG2 of the second port PT2.

The RF controller RFCN1 performs a second matching operation using a predetermined matching algorithm when, for example, 4 ms has elapsed from the first matching operation to set the frequency f12 of the RF generator RFG1 of the first port PT1. The information of the set frequency f12 is transmitted, as the frequency information IFPT1 of the first port PT1, to the RF controller RFCN2 through the control unit CNT.

The RF controller RFCN2 performs a second matching operation using a predetermined matching algorithm and the frequency comparison shown in FIG. 3 while referring to the received information IFPT1 of the frequency f12 when, for example, 4 ms has elapsed from the first matching operation to set the frequency f22 of the RF generator RFG2 of the second port PT2.

Therefore, by repeatedly setting the frequencies of f11 (f21) and f12 (f22) every 4 ms, for example, the output powers of the RF generators RFG1 and RFG2 can be controlled and the frequency interference can be avoided.

Further, the impedance matching can be performed while avoiding the frequency interference between the multiple output ports (the first port and the second port). Therefore, in the substrate processing apparatus in which the multiple antennas are disposed in the reactor 10 (chamber), a correct matching operation can be performed, which makes it possible to generate stable and high-quality plasma in the reactor 10 (chamber). Accordingly, the stable plasma processing can be performed on the substrate.

First Modification Example

Figure 5:
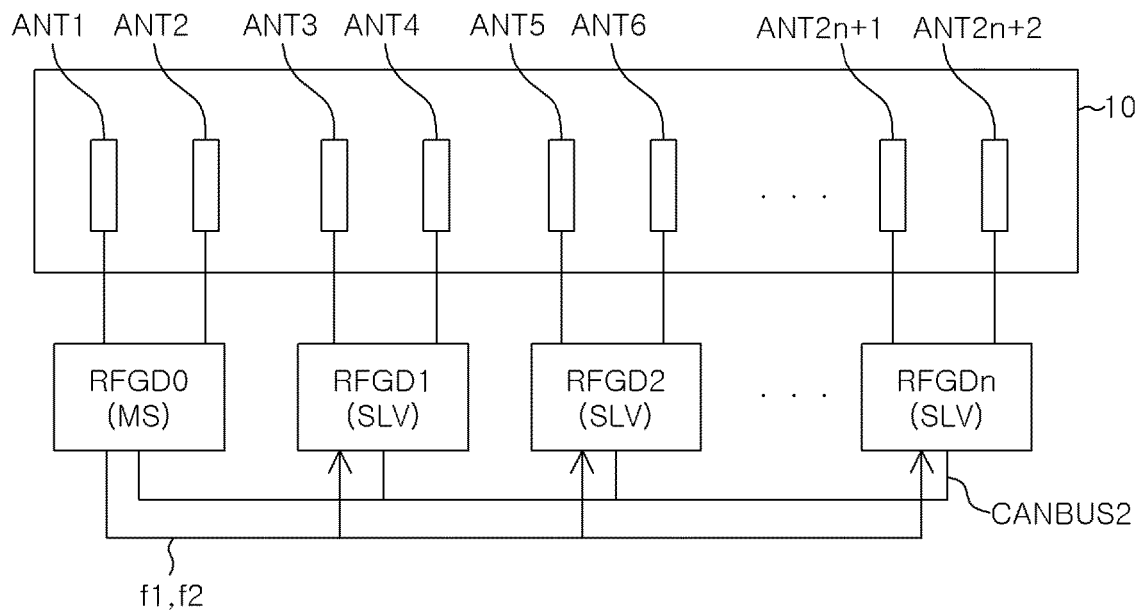
FIG. 5 shows a schematic configuration of a substrate processing apparatus having multiple RF generator devices according to a first modification example.

FIG. 5 shows a schematic configuration of a substrate processing apparatus having multiple RF generator devices according to a first modification example. In the first modification example, multiple antennas ANT1 to ANTn and multiple RF generator devices RFGD0 to RFGDn are disposed in the chamber 10 that is a reactor.

Each of the RF generator devices RFGD0 to RFGDn has the same configuration as that of the RF generator device RFGD shown in FIG. 1B. The antennas ANT1 and ANT2 are connected to the RF generator device RFGD0, and the antennas ANT3 and ANT4 are connected to the RF generator device RFGD1. Similarly, the antennas ANT5 and ANT6 are connected to the RF generator device RFGD2, and the antennas ANT$2n+1$ and ANT$2n+2$ are connected to the RF generator device RFGDn.

The RF generator devices RFGD0 to RFGDn are connected through a CAN bus CANBUS2. In this example, the RF generator device RFGD0 is set as a master MS, and the other RF generator devices RFGD1 to RFGDn are set as slaves SLV. The master MS and the slaves SLV are determined and identified by using the DIP switches respectively disposed at the control units CNT of the RF generator devices RFGD0 to RFGDn.

The RF generator device RFGD0 serving as the master MS is configured to transmit the information of the output frequencies f1 and f2 of the RF powers generated by the RF generators RFG1 and RFG2 in the RF generator device RFGD0 to the RF generator devices RFGD1 to RFGDn serving as the slaves SLV through broadcast communication with the CAN bus CANBUS2.

Figure 6:
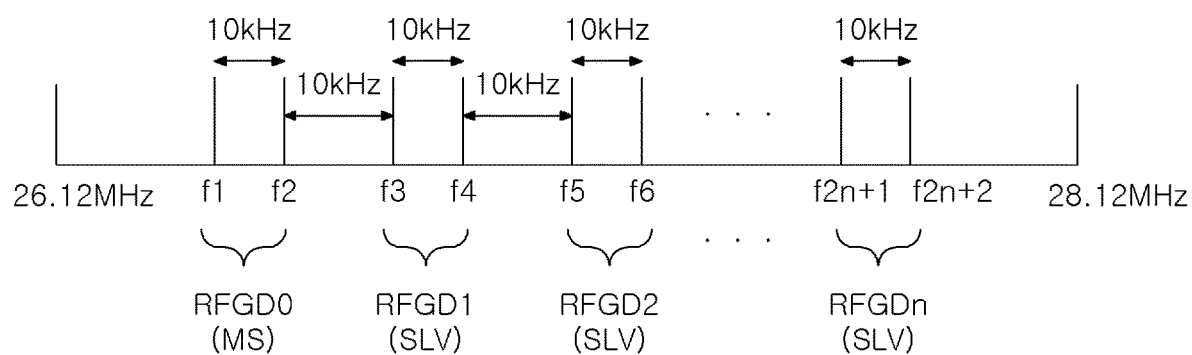
FIG. 6 shows an example of allocating output frequencies of the multiple RF generator devices of FIG. 5.

FIG. 6 shows an example of allocating output frequencies of the multiple RF generator devices of FIG. 5. Each of the RF generator devices RFGD0 to RFGDn is configured to generate RF power having an output frequency ranging between 26.12 MHz and 28.12 MHz, for example. In this example, the RF generator device RFGD0 generates the RF powers having the output frequencies f1 and f2. As described in the above embodiment, the difference frequency between the frequency f1 and the frequency f2 is within a range in which interference can be removed by attenuation in the digital filter DF1 or DF2. For example, the difference frequency is 10 kHz. The RF generator device RFGD1 generates RF powers having output frequencies f3 and f4. In the same manner as above, a difference frequency between the frequency f3 and the frequency f4 may be, e.g., 10 kHz. Further, a difference frequency between the frequency f2 and the frequency f3 may be, for example, 10 kHz. Further, the RF generator device RFGD2 generates RF powers having output frequencies f5 and f6. In the same manner as above, a difference frequency between the frequency f5 and the frequency f6 may be, for example, 10 kHz. Further, a difference frequency between the frequency f4 and the frequency f5 may be, for example, 10 kHz. Further, the RF generator device RFGDn generates RF powers having output frequencies f$2n+1$ and f$2n+2$. In the same manner as above, a difference frequency between the frequency f$2n+1$ and the frequency f$2n+2$ may be, for example, 10 kHz.

By setting the output frequencies of the RF powers in the above-described manner, the frequency range between 26.12 MHz and 28.12 MHz can be effectively utilized, and interference can be avoided in each of the RF generator devices RFGD0 to RFGDn.

The frequency setting shown in FIG. 6 can be automatically performed using the value of the DIP switch. For example, the master RF generator device RFGD0 and the slave RF generator devices RFGDn determine ID numbers thereof using the values (e.g., 0 to 15) of the DIP switches thereof. Specifically, the ID number of the master MS is set to 0, and the ID numbers of the slaves SLV are set to 1 to 15.

The slave SLV is set to a frequency separated by 10 kHz×n from the value of the frequency received from the master MS. Here, "n" indicates an ID number of each slave, and satisfies a condition "n≥1." Instead of setting the ID numbers using the DIP switches, it is also possible to use CANID set for the RF generator devices RFGD0 to RFGDn.

Figure 7:
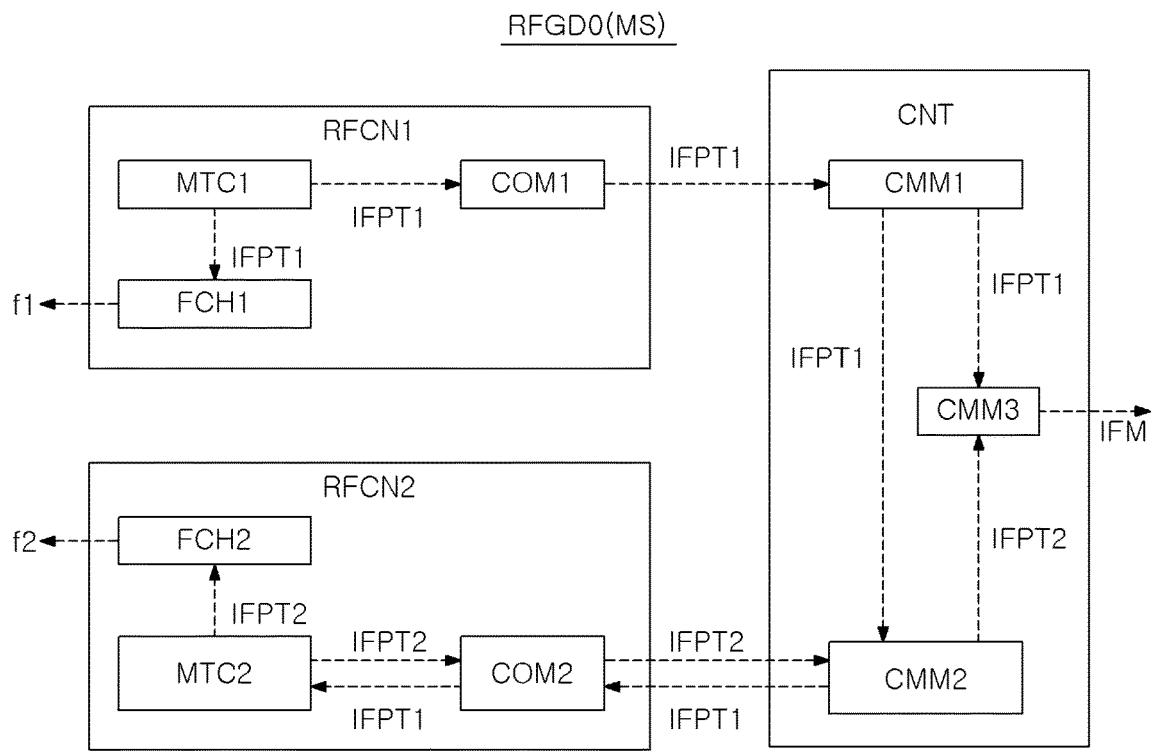
FIG. 7 shows an example of a logical configuration of an RF controller and a control unit of a master RF generator device.
Figure 8:
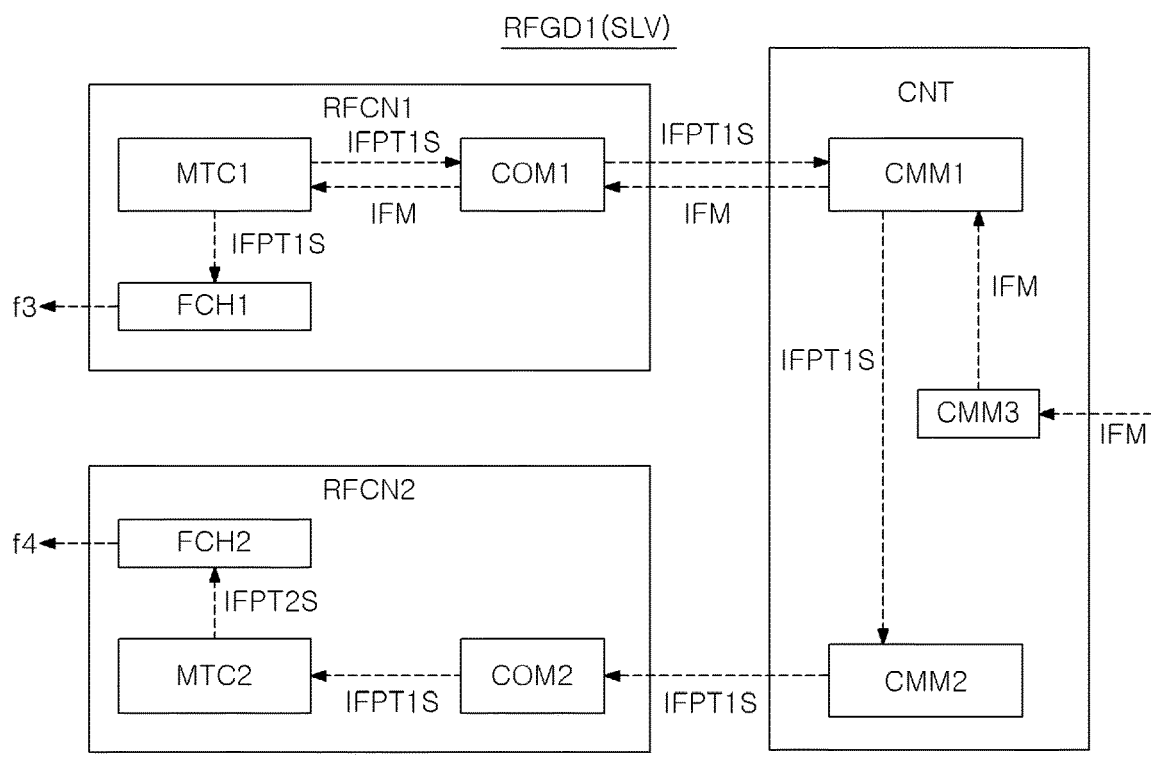
FIG. 8 shows an example of a logical configuration of an RF controller and a control unit of a slave RF generator device.

FIG. 7 shows an example of a logical configuration of the RF controller and the control unit of the master RF generator device. FIG. 8 shows an example of a logical configuration of the RF controller and the control unit of the slave RF generator device.

The configuration shown in FIG. 7 is different from that shown in FIG. 2 in that the RF controller RFCN2 of the master RF generator device RFGD0 outputs the frequency information IFPT2 of the second port PT2 from the matching operation unit MTC2 to the communication unit CMM2 of the control unit CNT through the communication unit COM2 and also in that an external communication unit CMM3, added to the control unit CNT of the RF generator device RFGD0, receives the frequency information IFPT1 from the communication unit CMM1 and the frequency information IFPT2 from the communication unit CMM2 and transmits frequency information IFM of the master RF generator device RFGD0. Here, the frequency information IFM includes the frequency information IFPT1 and the frequency information IFPT2. The external communication unit CMM3 outputs the frequency information IFM to the slave RF generator device RFGD1 through the CAN bus CANBUS2.

The frequency setting method of the RF controller RFCN1 and the RF controller RFCN2 of the RF generator device RFGD0 will be described with reference to FIG. 7.

First, the matching operation unit MTC1 determines the frequency f1 used for impedance matching of the first port PT1 from a predetermined matching algorithm.

The matching operation unit MTC1 transmits the frequency information IFPT1 to the frequency operating unit FCH1, and the frequency operating unit FCH1 outputs RF power having the desired frequency f1 from the RF generator RFG1 of the first port PT1.

Further, the matching operation unit MTC1 transmits the frequency information IFPT1 to the communication unit COM1, and the communication unit COM1 outputs the frequency information IFPT1 to the communication unit CMM1 of the control unit CNT through the bus BUS.

Further, the communication unit CMM1 outputs the frequency information IFPT1 of the first port PT1 to the communication unit CMM2 and the external communication unit CMM3.

The communication unit CMM2 outputs the frequency information IFPT1 of the first port PT1 to the communication unit COM2 of the RF controller RFCN2 through the bus BUS.

The communication unit COM2 outputs the frequency information IFPT1 of the first port PT1 to the matching operation unit MTC2.

The matching operation unit MTC2 of the RF controller RFCN2 compares the frequency information IFPT1 of the first port PT1 inputted from the communication unit COM2 with a frequency calculated from a predetermined matching algorithm to determine a frequency f2 used for the impedance matching of the second port PT2. The matching operation unit MTC2 outputs the frequency information IFPT2 of the second port PT2 to the frequency operating unit FCH2. Accordingly, the frequency operating unit FCH2 outputs RF power of the desired frequency f2 from the RF generator RFG2 of the second port PT2.

The matching operation unit MTC2 outputs the frequency information IFPT2 of the second port PT2 to the communication unit COM2. The communication unit COM2 outputs the frequency information IFPT2 of the second port PT2 to the communication unit CMM2. The communication unit CMM2 outputs the frequency information IFPT2 of the second port PT2 to the external communication unit CMM3. The external communication unit CMM3 outputs the frequency information IFPT1 of the first port PT1 and the frequency information IFPT2 of the second port PT2, as the frequency information IFM of the master, to the slave RF generator device RFGD1 through the CAN bus CANBUS2.

As shown in FIG. 8, the RF controller RFCN1 of the slave RF generator device RFGD1 includes a matching operation unit MTC1, a frequency operating unit FCH1, and a communication unit COM1. The RF controller RFCN2 of the RF generator device RFGD1 includes a matching operation unit MTC2, a frequency operating unit FCH2, and a communication unit COM2. The control unit CNT of the RF generator device RFGD1 includes a communication unit CMM1, a communication unit CMM2, and an external communication unit CMM3.

The frequency setting method of the RF controller RFCN1 and the RF controller RFCN2 of the RF generator device RFGD1 will be described with reference to FIG. 8.

The external communication unit CMM3 receives the frequency information IFM of the master through the CAN bus CANBUS2, and outputs the received frequency information IFM to the communication unit CMM1. The communication unit CMM1 outputs the frequency information IFM of the master to the communication unit COM1. The communication unit COM1 outputs the frequency information IFM of the master to the matching operation unit MTC1.

The matching operation unit MTC1 compares the frequency information IMF (IFPT1 and IFPT2) of the master inputted from the communication unit COM1 with a frequency calculated from a predetermined matching algorithm to determine a frequency f3 used for impedance matching of the first port PT1 on the slave side.

The matching operation unit MTC1 transmits the determined frequency f3 as frequency information IFPT1S to the frequency operating unit FCH1, and outputs the RF power having the frequency f3 from the RF generator RFG1 of the first port PT1 on the slave side.

The matching operation unit MTC1 outputs the determined frequency information IFPT1S of the first port PT1 to the communication unit COM1. The communication unit COM1 outputs the inputted frequency information IFPT1S of the first port PT1 to the communication unit CMM1. The communication unit CMM1 outputs the frequency information IFPT1S of the first port PT1 to the communication unit CMM2. The communication unit CMM2 outputs the frequency information IFPT1S of the first port PT1 to the communication unit COM2. The communication unit COM2 outputs the frequency information IFPT1S of the first port PT1 to the matching operation unit MTC2.

The matching operation unit MTC2 compares the frequency information IFPT1S of the first port PT1 inputted from the communication unit COM2 with a frequency calculated from a predetermined matching algorithm to determine a frequency f4 used for impedance matching of the second port PT2.

The matching operation unit MTC2 transmits the determined frequency f4 as frequency information IFPT2S to the frequency operating unit FCH2, and outputs the RF power having the frequency f4 from the RF generator RFG2 of the second port PT2 on the slave side.

Figure 9:
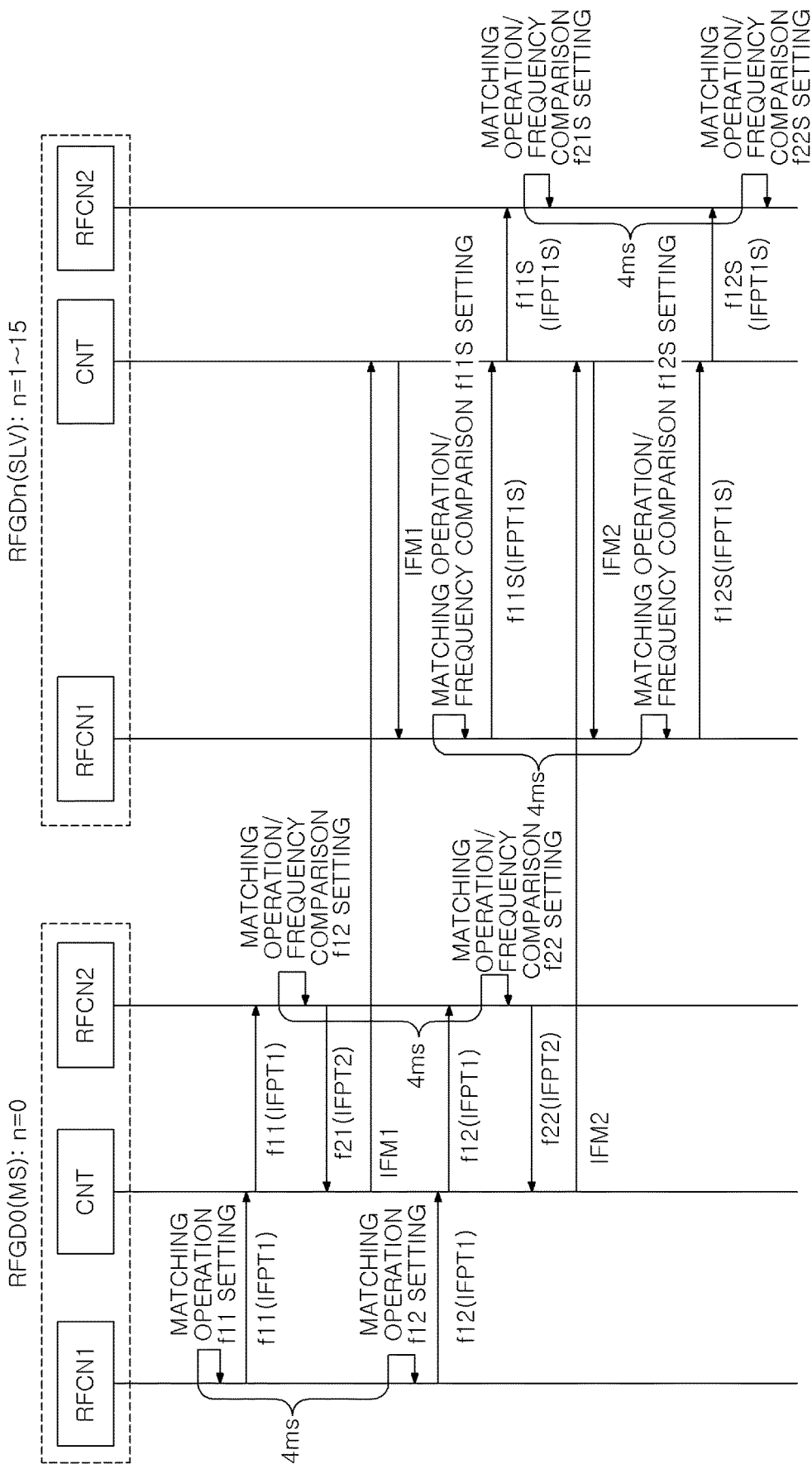
FIG. 9 shows an operation sequence of the master RF generator device and the slave RF generator devices.

FIG. 9 shows an operation sequence of the master RF generator device and the slave RF generator devices. In FIG. 9, "f11" and "f12" indicate the frequencies of the RF generator RFG1 of the first port PT1 of the master RF generator device RFGD0 (MS), and "f21" and "f22" indicate the frequencies of the RF generator RFG2 of the second port PT2 of the master RF generator device RFGD0 (MS). Further, "f11" and "f21" indicate first setting values, and "f12" and "f22" indicate second setting values. Further, "f11S" and "f12S" indicate the frequencies of the RF generator RFG1 of the first port PT1 of the slave RF generator device RFGDn (SLV), and "f21S" and "f22S" indicate the frequencies of the RF generator RFG2 of the second port PT2 of the slave RF generator device RFGDn (SLV). Further, "f11S" and "f21S" indicate first setting values, and "f12S" and "f22S" indicate second setting values.

When the RF generator device RFGDn (SLV) is the RF generator device RFGD1 (SLV), the following "f11S" and "f12S" correspond to the frequency f3 of FIG. 8, and the following "f21S" and "f22S" correspond to the frequency f4 of FIG. 8.

First, the operation sequence of the RF generator device RFGD0 (MS) will be described.

In the RF generator device RFGD0 (MS), the RF controller RFCN1 performs a first matching operation using a predetermined matching algorithm to set the frequency f11 of the RF generator RFG1 of the first port PT1. The information of the set frequency f11 is transmitted, as the frequency information IFPT1 of the first port PT1, to the RF controller RFCN2 through the control unit CNT.

The RF controller RFCN2 performs a first matching operation using a predetermined matching algorithm and the frequency comparison shown in FIG. 3 while referring to the received information IFPT1 of the frequency f11 to set the frequency f21 of the RF generator RFG2 of the second port PT2.

The RF controller RFCN2 transmits the information of the frequency f21, as the frequency information IFPT2 of the second port PT2, to the control unit CNT.

The control unit CNT transmits a first frequency information IFM1 including the frequency information IFPT1 and the frequency information IFPT2 to the control unit CNT of the RF generator device RFGDn (SLV).

The RF controller RFCN1 performs a second matching operation using a predetermined matching algorithm when, for example, 4 ms has elapsed from the first matching operation to set the frequency f12 of the RF generator RFG1 of the first port PT1. The information of the set frequency f12 is transmitted, as the frequency information IFPT1 of the first port PT1, to the RF controller RFCN2 through the control unit CNT.

The RF controller RFCN2 performs a second matching operation using a predetermined matching algorithm and the frequency comparison shown in FIG. 3 while referring to the received information IFPT1 of the frequency f12 when, for example, 4 ms has elapsed from the first matching operation and the frequency comparison to set the frequency f22 of the RF generator RFG2 of the second port PT2.

The RF controller RFCN2 transmits the information of the frequency f22, as the frequency information IFPT2 of the second port PT2, to the control unit CNT.

The control unit CNT transmits the second frequency information IFM2 including the frequency information IFPT1 and the frequency information IFPT2 to the control unit CNT of the RF generator device RFGDn (SLV).

Next, the operation sequence of the RF generator device RFGDn (SLV) will be described.

The control unit CNT that has received the first frequency information IFM1 transmits the frequency information IFM2 to the RF controller RFCN1.

The RF controller RFCN1 performs a first matching operation using a predetermined matching algorithm and the frequency comparison shown in FIG. 3 while referring to the received frequency information IFM2 to set the frequency f11S of the RF generator RFG1 of the first port PT1. The information of the set frequency f11S is transmitted, as the frequency information IFPT1S of the first port PT1, to the RF controller RFCN2 through the control unit CNT.

The RF controller RFCN2 performs a first matching operation using a predetermined matching algorithm and the frequency comparison shown in FIG. 3 while referring to the received information IFPT1S of the frequency f11S to set the frequency f21S of the RF generator RFG2 of the second port PT2.

The control unit CNT that has received the second frequency information IFM2 transmits the frequency information IFM1 to the RF controller RFCN1.

The RF controller RFCN1 performs a second matching operation using a predetermined matching algorithm and the frequency comparison while referring to the received frequency information IFM1 when, for example, 4 ms has elapsed from the first matching operation and the frequency comparison to set the frequency f12S of the RF generator RFG1 of the first port PT1. The information of the set frequency f12S is transmitted, as the frequency information IFPT1S of the first port PT1, to the RF controller RFCN2 through the control unit CNT.

The RF controller RFCN2 performs a second matching operation using a predetermined matching algorithm and the frequency comparison shown in FIG. 3 while referring to the received information IFPT1S of the frequency f12S when, for example, 4 ms has elapsed from the first matching operation and the frequency comparison to set the frequency f22S of the RF generator RFG2 of the second port PT2.

Accordingly, the output frequencies of the RF powers generated from the respective ports of the RF generator device RFGD0 (MS) and the RF generator device RFGDn (SLV) can be set such that the impedance matching can be performed while avoiding frequency interference.

Therefore, the correct matching operation can be performed so that stable and high-quality plasma can be generated in the reactor of the substrate processing apparatus. Accordingly, the processing using stable plasma can be performed on the substrate.

Further, when the multiple RF generator devices of the present disclosure are connected to each other, the same control software can be used for the master RF generator device and the slave RF generator devices. Therefore, it is not necessary to separately develop the software for the master RF generator device and the software for the slave RF generator devices, which is cost-effective. Hence, the software development cost can be reduced.

Second Modification Example

Figure 10A:
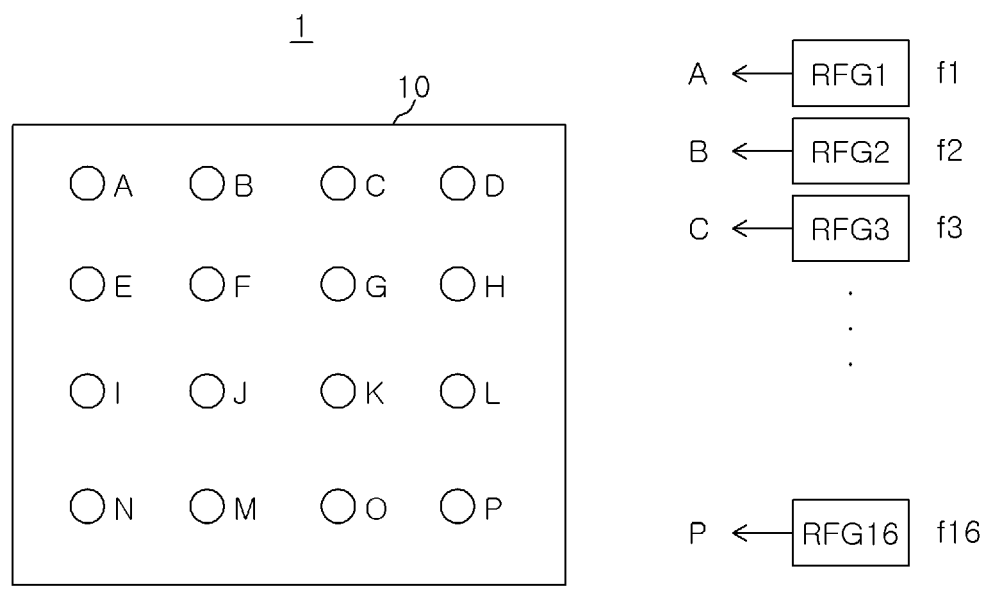
FIG. 10A is a top view showing a first example of a configuration of a reactor having multiple antennas according to a second modification example.
Figure 10B:
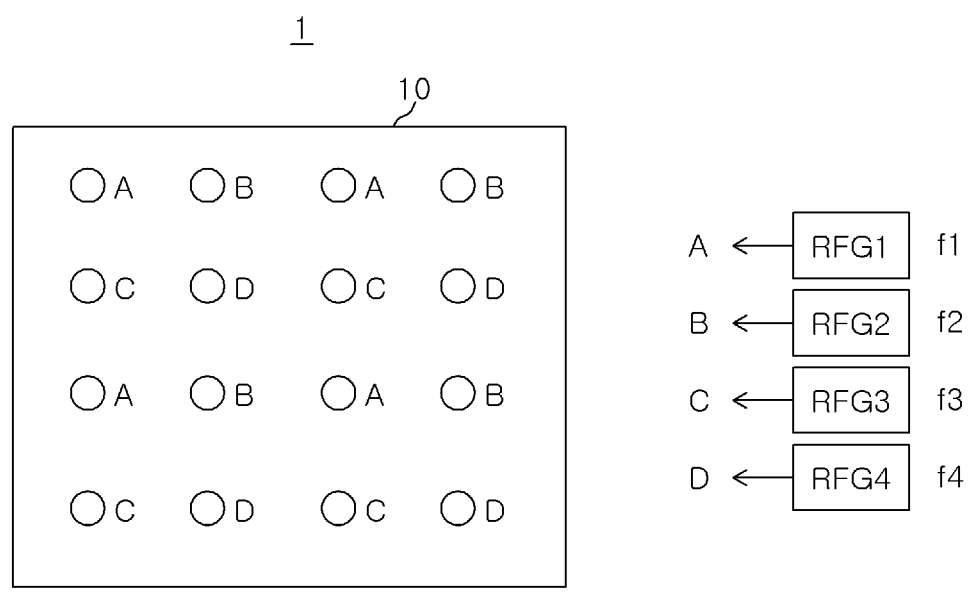
FIG. 10B is a top view showing a second example of a configuration of a reactor having multiple antennas according to the second modification example.

FIGS. 10A and 10B are top views of a reactor provided with multiple antennas according to the second modification example. FIGS. 10A and 10B show an example of a configuration in which sixteen antennas are arranged in the chamber (reactor) 10 of the substrate processing apparatus 1. The sixteen antennas are disposed on a ceiling wall of the chamber (reactor) 10 to be positioned above the substrate disposed in the chamber (reactor) 10. The substrate is, for example, a glass substrate used for manufacturing a display panel.

FIG. 10A shows a first example of a configuration in which sixteen antennas A to P are arranged in the chamber 10 (on the ceiling wall) in a matrix shape in rows and columns at equal intervals. The RF powers are supplied from the RF generators RFG1 to RFG16 to the antennas A to P through the matching units, respectively. For example, the RF generator RFG1 is connected to the antenna A to supply the RF power having the frequency f1 through the matching unit. The RF generator RFG2 is connected to the antenna B to supply the RF power having the frequency f2 through the matching unit. The output frequencies f1 to f16 of the RF generators RFG1 to RFG16 are set such that the frequency interference can be avoided as described with reference to FIGS. 5 and 6.

In other words, in FIG. 10A, the number of the RF generators having different output frequencies is equal to the number of the antennas. In this case, since the number of the frequencies increases by the number of the RF generators, the contents managed by the system may increase. Further, since it is necessary to synchronize the RF generators, the exchange of frequency information is required. Moreover, since the number of the RF generators increases, the size and the cost may also increase.

FIG. 10B shows a second example of a configuration in which sixteen antennas are arranged in the chamber 10 (at a ceiling wall) in a matrix shape in rows and columns at equal intervals. In FIG. 10A, the RF powers of different frequencies are supplied to the antennas. In FIG. 10B, the sixteen antennas are classified into, e.g., four groups A, B, C, and D. The antennas A of the first group are connected to the RF generator RFG1 that outputs the RF power having the frequency f1 through the matching unit. The antennas B of the second group are connected to the RF generator RFG2 that outputs the RF power having the frequency f2 through the matching unit. The antennas C of the third group are connected to the RF generator RFG3 that outputs the RF power having the frequency f3 through the matching unit. The antennas D of the fourth group are connected to the RF generator RFG4 that outputs the RF power having the frequency f4 through the matching unit. The output frequencies f1 to f4 of the RF generators RFG1 to RFG4 are set such that the frequency interference can be avoided as described with reference to FIGS. 5 and 6.

As shown in FIG. 10B, around the antenna of one group, the antennas of other groups are arranged. For example, the antennas B, C, and D of the second group, the third group, and the fourth group are arranged around the antenna A of the first group. The number of the groups (four groups in this example) is smaller than the number of antennas (sixteen antennas in this example). Further, the number of the groups (four groups in this example) is equal to the number of the RF generators (four RF generators RFG1 to RFG4 in this example).

The interference that occurs in the chamber 10 may possibly be avoided as a physical distance increases. Therefore, when the antennas are spaced apart from each other by a certain distance (in other words, when there can be a high occurrence of interference between the adjacent antennas and the interference can be avoided by increasing the distance therebetween), the same frequency may be used for the antennas that are not adjacent to each other. In other words, as shown in FIG. 10B, the same frequency is used for the physically separated antennas. Accordingly, compared to the case where sixteen frequencies f1 to f16 and sixteen RF generators RFG1 to RFG16 are required as shown in FIG. 10A, the number of the frequencies and the number of the RF generators can be reduced to the four frequencies f1 to f4 and the four RF generators RFG1 to RFG4 as shown in FIG. 10B.

Accordingly, the frequency management can become simpler by reducing the types of frequencies and the required number of the RF generators. In this example, since four output frequencies f1 to f4 can be used for sixteen antennas, the output of each of the RF generators RFG1 to RFG4 can be increased by four times and divided into four.

Although the present disclosure conceived by the present inventors has been specifically described based on the above-described embodiments and examples, the present disclosure can be variously modified without being limited to the above-described embodiments.

It is also possible to solve the problem by adjusting the antennas such that the frequencies do not become close to each other when they are finally matched by intentionally shifting a characteristic impedance of each antenna at the time of frequency matching based on the opposite concept of the present disclosure.

When the frequency matching is not used, it is possible to avoid interference by shifting the frequency of the RF generator. In this case, it is assumed a mechanism for removing an interference wave that includes, for example, the FFTs (FFT1 and FFT2) and the digital filters DF1 and DF2, is used for detection of a reflected wave.

INDUSTRIAL APPLICABILITY

As described above, in accordance with the present disclosure, it is possible to provide an RF generator device capable of eliminating an effect of an interference wave at the time of impedance matching.

DESCRIPTION OF REFERENCE NUMERALS

1: Substrate processing apparatus
10: Chamber (reactor)
MT1, MT2: Matching unit
ANT1, ANT2: Antenna
RFGD: RF generator device
RFG1, RFG2: RF generator
RFCN1, RFCN2: RF controller
CNT: Control unit
FFT1, FFT2: Fast Fourier transformer
DF1, DF2: Digital filter
MTC1, MTC2: Matching operation unit
FCH1, FCH2: Frequency operating unit
COM1, COM2, CMM1, CMM2: Communication unit
CMM3: External communication unit

The invention claimed is:

1. A radio frequency (RF) generator device for supplying RF powers of different frequencies to multiple antennas disposed in a chamber, the RF generator device comprising:
a plurality of RF generators configured to supply the RF powers of the different frequencies to the multiple antennas; and
a plurality of RF controllers configured to control the RF generators, respectively,
wherein each of the RF controllers includes:
a fast Fourier transformer; and
a filter,
wherein the fast Fourier transformer performs fast Fourier transform on a signal introduced as a reflected wave to decompose the signal into frequency components, and
the filter removes waves having frequency components that are not outputted from the corresponding RF generator.

2. The RF generator device of claim 1, wherein a difference frequency between the frequencies of the RF powers supplied to the antennas is within a range where interference is removable by the filter.

3. The RF generator device of claim 1, further comprising:
a plurality of matching units disposed between the antennas and the RF generators.

4. A radio frequency (RF) generator device comprising:
a first RF generator device connected to a first antenna and a second antenna disposed in a chamber,
wherein the first RF generator device includes:
a first RF generator configured to supply RF power having a first frequency to the first antenna;
a second RF generator configured to supply RF power having a second frequency to the second antenna;
a first RF controller configured to control the first RF generator; and
a second RF controller configured to control the second RF generator,
wherein the first RF controller includes:
a first fast Fourier transformer; and
a first filter,
wherein the second RF controller includes: a second fast Fourier transformer; and a second filter,
wherein the first and the second fast Fourier transformers perform fast Fourier transform on a signal introduced as a reflected wave to decompose the signal into frequency components, and
the first filter and the second filter remove waves having frequency components that are not outputted from the corresponding RF generator between the first RF generator and the second RF generator.

5. The RF generator device of claim 4, wherein the second RF controller compares the first frequency with a frequency calculated from a predetermined matching algorithm to determine the second frequency used for impedance matching.

6. The RF generator device of claim 5, wherein a difference frequency between the first frequency and the second frequency is within a range where interference is removable by the filter.

7. The RF generator device of claim 6, wherein the difference frequency is 10 kHz.

8. The RF generator device of claim 5, further comprising:
a second RF generator device connected to a third antenna and a fourth antenna disposed in the chamber, wherein the second RF generator device includes:
a third RF generator configured to supply RF power having a third frequency to the third antenna;
a fourth RF generator configured to supply RF power having a fourth frequency to the fourth antenna;
a third RF controller configured to control the third RF generator; and
a fourth RF controller configured to control the fourth RF generator,
wherein the third RF controller includes:
a third fast Fourier transformer; and
a third filter,
wherein the fourth RF controller includes: a fourth fast Fourier transformer; and a fourth filter, wherein the third and the fourth fast Fourier transformers perform fast Fourier transform on the signal introduced as a reflected wave to decompose the signal into frequency components, and the third filter and the fourth filter remove waves having frequency components that are not outputted from the corresponding RF generator between the third RF generator and the fourth RF generator.

9. The RF generator device of claim 8, wherein the third RF controller compares the first frequency and the second frequency with a frequency calculated from a predetermined matching algorithm to determine the third frequency used for impedance matching, and
the fourth RF controller compares the third frequency with a frequency calculated from a predetermined matching algorithm to determine the fourth frequency used for impedance matching.

10. The RF generator device of claim 9, wherein a difference frequency between the third frequency and the fourth frequency is within a range where interference is removable by the filter.

* * * * *